United States Patent [19] [11] Patent Number: 4,725,875
Hsueh [45] Date of Patent: Feb. 16, 1988

[54] MEMORY CELL WITH DIODES PROVIDING RADIATION HARDNESS

[75] Inventor: Fu-Lung Hsueh, Plainsboro Township, Middlesex County, N.J.

[73] Assignee: General Electric Co., Schenectady, N.Y.

[21] Appl. No.: 782,581

[22] Filed: Oct. 1, 1985

[51] Int. Cl.$^4$ ............................................. H01L 27/02
[52] U.S. Cl. .................................. 357/42; 357/23.13; 357/23.6; 357/23.7; 357/59
[58] Field of Search ............... 357/40, 44, 23.13, 23.6, 357/23.7, 59, 42, 23.12, 23.11

[56] References Cited

U.S. PATENT DOCUMENTS 3,476,617  11/1969  Robinson .......................... 357/44 X
3,983,620  10/1976  Spadea ............................... 357/42 X
4,199,773   4/1980  Goodman et al. .................. 357/23.7
4,468,852   9/1984  Cerofolini ......................... 357/42 X
4,491,859   1/1985  Hijiya et al. ..................... 357/23.7 X

FOREIGN PATENT DOCUMENTS 56-94670  7/1981  Japan ...................................... 357/42

OTHER PUBLICATIONS

Napoli et al, "CMOS/SOS 4K Rams Hardened to 100 Krads(Si)", *IEEE Trans. on Nuclear Science*, vol. NS-29, Dec. 1984, pp. 1707-1711.

*Primary Examiner*—Martin H. Edlow
*Assistant Examiner*—William A. Mintel
*Attorney, Agent, or Firm*—Henry I. Steckler; Allen LeRoy Limberg

[57] ABSTRACT

A memory cell has a pair of cross-coupled inverters, such as a CMOS pair. Diodes are coupled in series with the transistors to reduce the possibility of radiation-induced currents in the transistors causing a change in state of the cell by providing resistance that increases the cell time constant. The transistors and the diodes are formed in the body of a semiconducting material. The diodes require at most only a small additional cell area as compared with a cell that does not have the diodes.

11 Claims, 5 Drawing Figures

MEMORY CELL WITH DIODES PROVIDING RADIATION HARDNESS This invention was made with Government support under Contract No. DNA 0001-84-C-0404 awarded by the Defense Nuclear Agency. The Government has certain rights in this invention.

BACKGROUND OF THE INVENTION

The present invention relates to a memory cell for use in a random access memory (RAM), and more particularly, to such a cell that is radiation hard.

A typical RAM cell comprises two inverters, with each inverter comprising a pair of metal oxide semiconductor (MOS) transistors. Each pair has a P-conductivity type channel (PMOS) transistor and a N-conductivity type channel (NMOS) transistor. The RAM may be used while exposed to radiation, such as cosmic rays, that produces electrons and holes. This charge can change the charge stored on the gate capacitance of a MOS transistor which can cause a "single event upset" (SEU), which is a change in state of the memory cell.

It is known from U.S. patent application Ser. No. 665,008, filed Oct. 26, 1984, to use the resistance of buried contact diodes coupled in series with the drains of the PMOS transistors and the resistance of gate-drain tied intrinisic mode MOS transistors coupled in series with the drains of the NMOS transistors to raise the critical charge ($Q_c$) necessary to cause an SEU. This is achieved since the time constant of the cell is increased by said resistances. Since the radiation-induced current only exists briefly, it cannot cause a change in state of a cell with a time constant that is large relative to the duration of the radiation. However, an extra masking step is required during ion implantation of the intrinsic mode transistors to adjust their threshold voltage to be nearly zero. Further, the circuit of said patent is constructed on sapphire, which is expensive compared with bulk silicon.

SUMMARY OF THE INVENTION

A memory cell has first and second inverters. Each inverter comprises first and second MOS transistors. A first pair of diodes is respectively series coupled to the first MOS transistors to reduce the possibility that radiation induced currents in the first transistors cause a change in state of the cell by providing a resistance that increases the time constant of the cell. In accordance with a first aspect of the invention, a second pair of diodes is respectively series coupled to the second transistors to reduce the possibility of radiation-induced currents in the second transistors causing such a change in state. In accordance with a further aspect of the invention, the transistors and the diodes are formed in a body of semiconducting material. The diodes can be formed with at most only a small increase in cell area as compared with a cell not having the diodes.

BRIEF DESCRIPTION OF THE DRAWING

Corresponding reference numerials are applied to corresponding elements in the Figures.

DETAILED DESCRIPTION OF THE PREFERRED EMBODIMENTS

Figure 1:
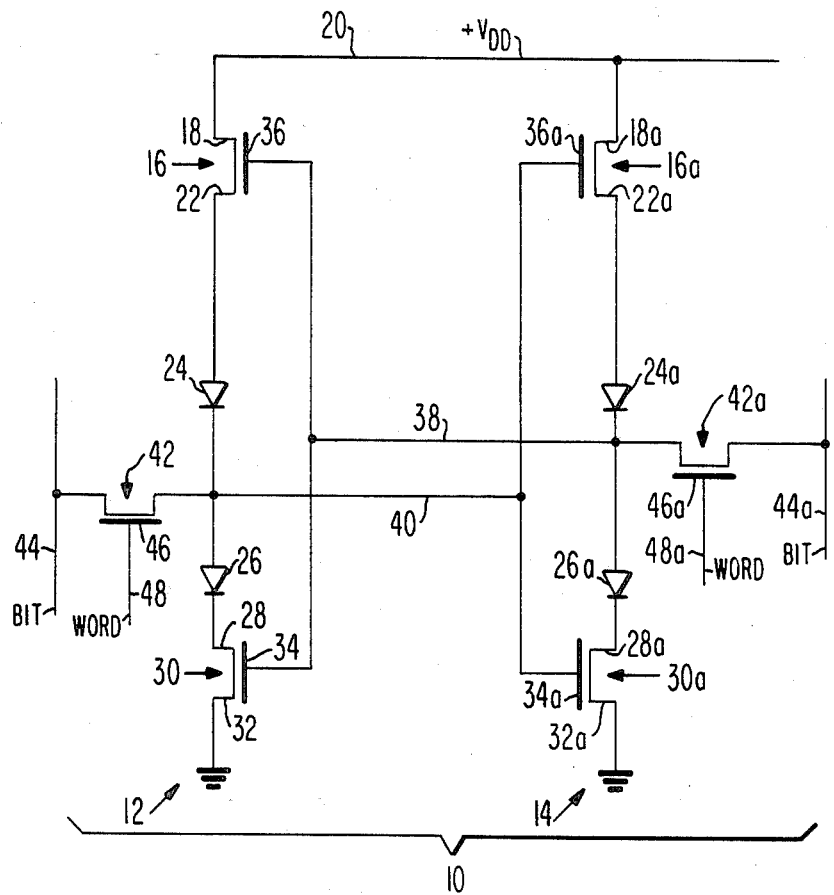
FIG. 1 is a schematic circuit diagram of an embodiment of the invention.

FIG. 1 shows a static memory cell 10 comprising cross-coupled inverters 12 and 14. In inverter 12, PMOS enhancement mode transistor 16 has a conduction electrode or source 18 coupled to rail 20 having a positive supply voltage, $V_{DD}$, typically between about 5 and 10 volts. A conduction electrode or drain 22 of transistor 16 is coupled to an anode of a diode 24. The cathode of diode 24 is coupled to the anode of a diode 26. A cathode of diode 26 is coupled to a drain electrode 28 of an NMOS enhancement-mode transistor 30. Transistor 30 has a source electrode 32 that is grounded, and a gate electrode 34 that is coupled to a gate electrode 36 of transistor 16.

The inverter 14 shown in the right hand portion of FIG. 1, is identical to that of inverter 12 and, therefore, will not be described. Corresponding reference numerals have been used on corresponding circuit elements with the suffix "a" added.

The gates 34 and 36 are connected to the junction of diodes 24a and 26a by line 38; the gates 34a and 36a are connected to the junction of diodes 24 and 26 by a line 40. An MOS access transistor 42 has a conduction electrode connected to line 40, another conduction electrode connected to a bit line 44, and a gate 46 connected to a word line 48. Another MOS access transistor 42a is similarly connected to line 38, bit line 44a, and word line 48a. Word line 48a has the same signal on it as does word line 48.

A precharge voltage of $V_{DD}/2$ is applied to bit lines 44 and 44a to initiate operation of cell 10. To write a ZERO into cell 10, access transistors 42 and 42a are turned ON by setting the voltage on word lines 48 and 48a to $V_{DD}$. Further, a data line (not shown) coupled to bit line 44 reduces the bit line 44 voltage to zero volts. Also, the bit line 44a voltage is set to $V_{DD}$ by an output of an inverter (not shown) whose input is coupled to the data line (not shown). The voltage at the gates 34 and 36 is now equal to $V_{DD}$ and the voltage at the gates 34a and 36a is now equal to zero. Hence transistor 30a is OFF, and transistor 16a is ON. Similarly, transistor 30 is ON, and transistor 16 is OFF.

To write a ONE into the cell 10, the transistors 42 and 42a are turned ON as described above, and the data line directly applies to the voltage $V_{DD}$ to bit line 44 and zero volts to bit line 44a through the inverter. The voltage at the gates 34a and 36a is now equal to $V_{DD}$. Transistor 16a is now OFF, and transistor 30a is now ON. Similarly, the zero volts on line 44a is applied to the gates 34 and 36 by line 38. Transistor 16 is now ON, and transistor 30 is now OFF.

Transistors 42 and 42a are turned ON by setting word lines 48 and 48a to $V_{DD}$ to permit reading cell 10. If the cell 10 is storing a ZERO, then the voltage on line 44 drops from $V_{DD}/2$ towards zero volts, while the voltage on line 44a rises from $V_{DD}/2$ towards $V_{DD}$. If the cell 10 is storing a ONE, the voltage on line 44 rises from $V_{DD}/2$ towards $V_{DD}$, while the voltage on bit line 44a drops from $V_{DD}/2$ toward zero. A differential sense amplifier (not shown) that has differential inputs respectively coupled to the bit lines 44 and 44a senses these voltage changes. As known in the art, a precharge voltage of $V_{DD}$ can be applied to bit lines, 44 and 44a. The read and write operations are similar to the operations described above.

In the presence of radiation, electron-hole pairs are generated, which then disassociate. If a transistor is ON, the existing current is large compared to the radiation-induced current, and thus the latter has no effect on the state of cell 10. If a transistor is OFF and the electrons and holes are generated outside the depletion region thereof, charges having the same sign as that of the mobile charges add only a small amount to said charges, while charges having the opposite sign will combine with said mobile charges. There are no mobile carriers to combine with or add to if the radiation-induced charge is generated in the depletion region of transistors that are OFF, and a radiation-induced current will therefore exist.

If cell 10 is storing a ZERO, depletion regions (not shown) are formed around drains 22 and 28a of OFF transistors 16 and 30a, respectively. Radiation-induced charge generated in the depletion region at drain 22 successively flows in a path from drain 22, through diode 24, line 40, to gates 34a and 36a to change the charge, and thus the voltage, on the inherent capacitances to ground of lead 40 and gates 34a and 46a. Because of the resistance of the diode 24, the duration of a radiation-induced current is short compared to the time constant (a few nanoseconds) of this path, reducing the possibility of cell 10 changing state.

In particular, it has been found that the resistance of a diode during a current transient, such as caused by radiation, is sufficiently high that a voltage drop of about 2 to 4 volts occurs thereacross instead of the more typical voltage drop of 0.6 volts that occurs during the steady state operation of a silicon diode. It is believed that this large voltage drop is due to the existance of a displacement current in the diode that adds to the existing diffusion and drift currents. Thus the diode provides a time varying resistance. By "diode" is also meant other time varying resistors, such as a diode-connected transistor.

Radiation-induced charge generated in the depletion region at drain 28a successively flows in a path through transistor 30a to ground, the inherent capacitances to ground of lead 38 and gates 34 and 36, and then through diode 26a to the drain 28a. This current will change the voltages at gates 34 and 36. However, as explained above, diode 26a provides resistance, thereby raising the time constant in said path, and thus reduces the possibility of cell 10 changing state due to a radiation-induced current.

Similarly, if cell 10 is set to store a ONE, then the possibility of a change in state thereof due to charges generated in the depletion regions at the drains 22a and 28 is respectively reduced by diodes 24a and 26.

Figure 2:
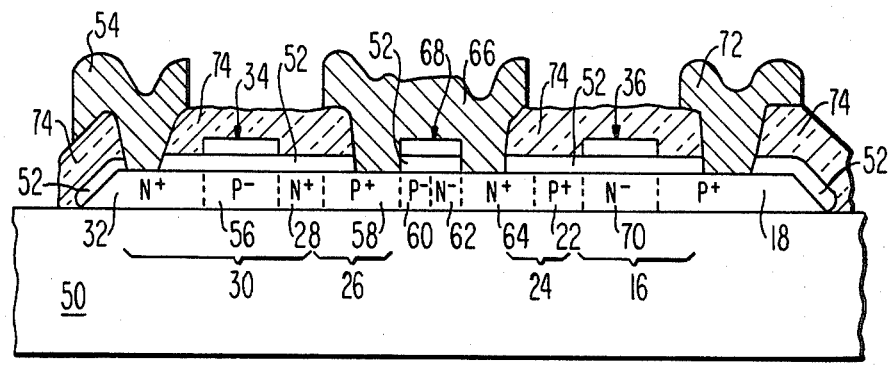
FIGS. 2, 3, 4, and 5 are cross-sections of different embodiments of an integrated circuit (IC) of a portion of the schematic of FIG. 1.

FIG. 2 shows a first embodiment of the construction of inverter 12 with diodes 26 and 24 formed as junction diffusion diodes. The N+-conductivity type first region or source 32 is disposed on the left side of an insulating substrate 50, such as sapphire. A P−-conductivity type conduction channel second region 56, is disposed next to source 32. Adjacent region 56 is N+-conductivity type third region or drain 28 of transistor 30, which is also the cathode of diode 26. Disposed next to drain 28 is a P+-conductivity type fourth region 58, which is the anode of diode 26. Adjacent region 58 is a P−-conductivity type region 60 that was doped at the same time as region 56.

Next is an N−-conductivity type region 62, which is formed at the same time as region 70 (described below). Regions 60 and 62 form a diode, which is reversed biased during operation of the inverter 12 so that no current flows therethrough. Next is an N+-conductivity type fifth region 64, which is the cathode of diode 24. The diodes 24 and 26 (and also the diodes 22a and 26a which have identical construction) can be formed with only a slight increase in cell area (10 percent) as compared to a conventional 6 transistor cell. Adjacent region 64 is P+-conductivity type sixth region or drain 22, which is also the anode of diode 24, and next to drain 22 is an N−-conductivity type conduction channel seventh region 70. The P+-conductivity type eighth region or source 18 lies adjacent region 70.

Above conduction channel regions 56 and 70 is an insulating layer 52, such as silicon dioxide. Conductors 54 and 72, such as aluminum metalizations, extend through layer 52 to contact sources 32 and 18, respectively. Conductor 54 connects source 32 to ground, while conductor 72 connects source 18 to rail 20 of FIG. 1. Above layer 52 and channel region 56 is conducting gate 34, such as N+-conductivity type polycrystalline silicon (polysilicon). Similarly, above layer 52 and channel region 70 is conducting gate 36, such as N+-conductivity type polysilicon. Above regions 60 and 62 and layer 52 is a conducting layer 68, such as N+-conductivity type polysilicon, that connects the junction of diodes 24 and 26 to the gates 34a and 36a of transistors 30a and 16a, respectively, of inverter 14. Above layer 68 is a conductive layer 66, such as aluminum metalization, which connects regions 58 and 64 together. A reflow glass layer 74 protects the IC.

Figure 3:
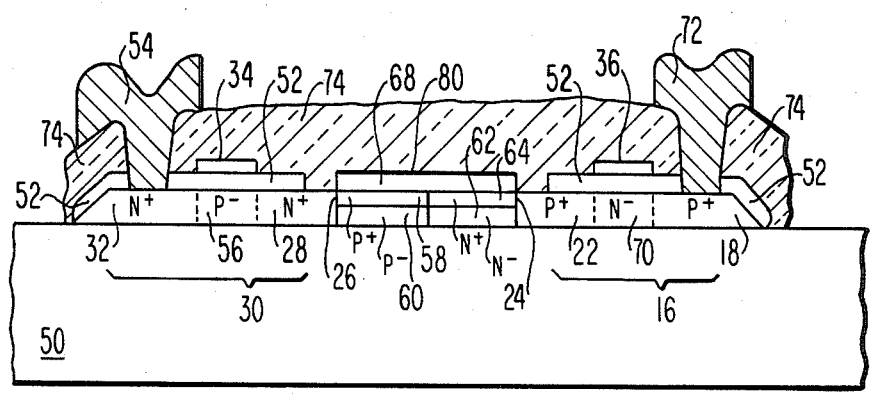

FIG. 3 shows a second embodiment of the construction of inverter 12 which is similar to FIG. 2 except that diodes 24 and 26 are formed as buried contact diodes, and therefore only the differences will be described. Regions 58 and 64 are formed over regions 60 and 62, respectively. The diode 26 is thereby formed at the junction of regions 28 and 58, and the diode 24 is formed at the junction of regions 64 and 22. A conductive layer 80, such as a silicide, is disposed over layer 68 to improve the conductivity thereof so as to ensure that a diode is not formed at the junction of regions 58 and 64. The diodes 24 and 26 (and also diodes 24a and 26a) of this embodiment can be formed with a 15 percent increase in cell area as compared to a conventional 6 transistor cell. While a buried contact resistance is formed at the junction of layer 68 and both regions 58 and 64, it is small compared to the resistance of diodes 26 and 24 during a radiation-induced current transient.

Figure 4:
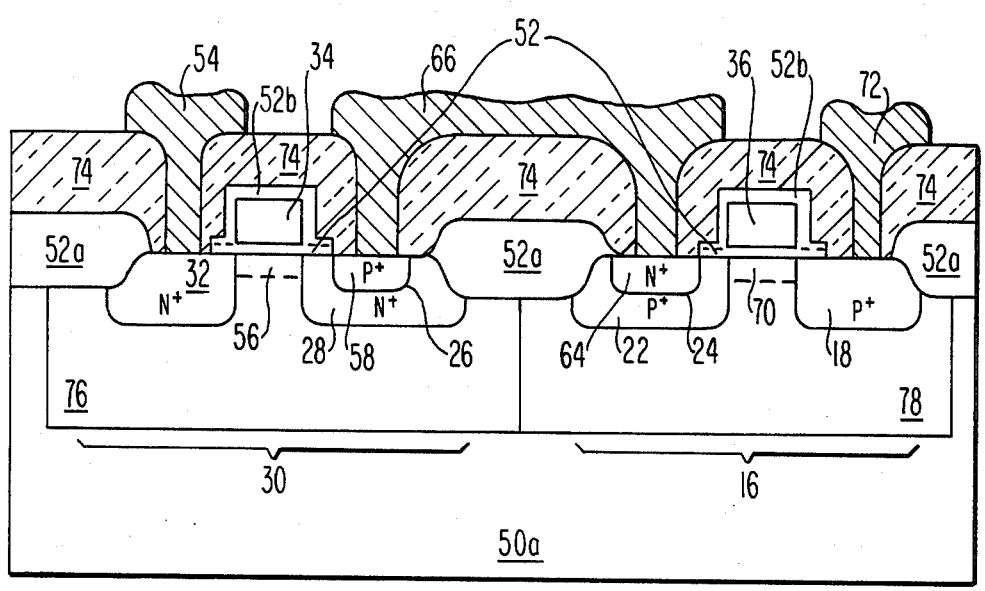

FIG. 4 shows a third embodiment of the construction of inverter 12 wherein the diodes are formed as junction diffusion diodes. A conducting substrate 50a, such as N+-conductivity type bulk silicon, has a P−-conductivity type well 76 and an N⊕-conductivity type well 78 therein. In turn transistors 30 and 16 are respectively disposed in wells 76 and 78 with insulating field regions 52a, such as silicon dioxide, isolating adjacent transistors, and insulating layers 52b, such as silicon dioxide, isolating the gates. Regions 58 and 64 are respectively formed in drains 28 and 22 by conventional masking followed by ion implantation for each of the regions 58 and 64. It will be seen that diode 26 is formed at the junction of regions 28 and 58, and diode 24 is formed at the junction of regions 22 and 64.

The regions 28 and 22 are preferably about 0.3 micrometer ($\mu$m) thick to prevent punchthrough of the depletion region from regions 58 and 64, respectively, into the wells 76 and 78, respectively. When the length of the channel regions 56 and 70 is less than about 1.5

μm, the thicknesses of regions 28 and 22 should be less than about 0.3 μm for best operation of transistors 16 and 30, making the formation of regions 58 and 64 difficult.

Figure 5:
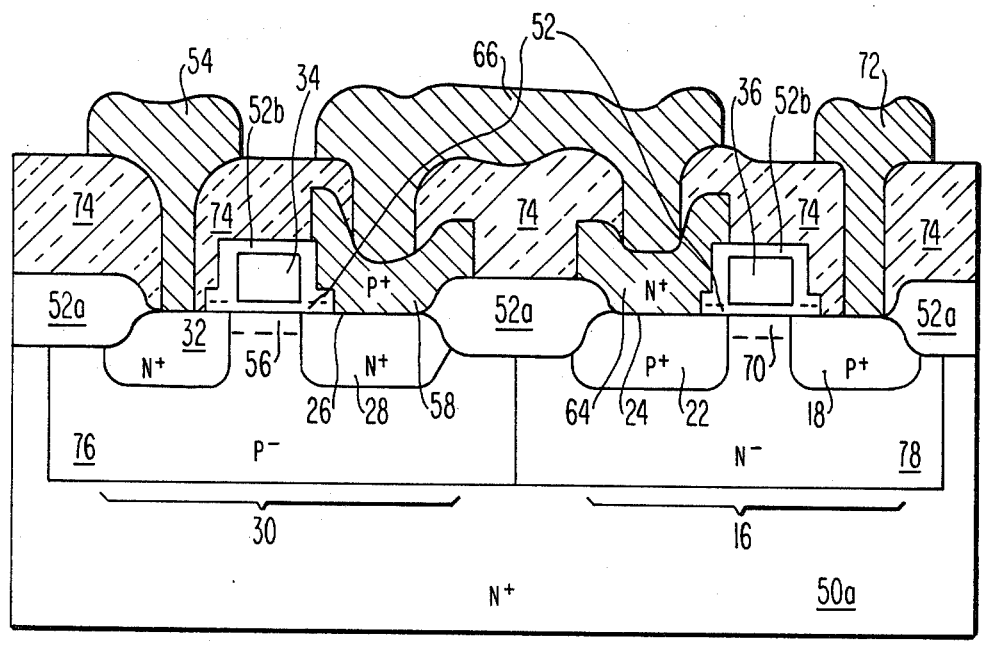

FIG. 5 shows the construction of a fourth embodiment of inverter 12 which avoids this problem. As shown therein, regions 58 and 64 comprise P+-conductivity type and N+-conductivity type polysilicon, respectively. Again the diode 26 is formed at the junction of regions 58 and 28, and diode 24 is formed at the junction of regions 64 and 22. In contradistinction to the embodiment of FIG. 4, diodes 26 and 24 are formed exactly at the surface of regions 28 and 22, respectively, thereby avoiding the punchthrough problem. If regions 58 and 64 are silicides, then metalization 66 can be eliminated and regions 58 and 64 formed as a single region under glass layer 74 with appropriate opposite conductivity type doping at the portions over regions 28 and 22.

It will be seen that for the embodiments of FIGS. 4 and 5, the regions 28 and 22 respectively isolate the regions 58 and 64 from the channel regions 56 and 70. This isolation inherently occurs in the embodiments of FIGS. 2 and 3 since substrate 50 is an insulator. Further, the embodiments of FIGS. 4 and 5 can be formed with virtually no increase in the area of cell 10.

It will be appreciated that in each of the embodiments of FIGS. 2-5, the inverter 14 has the identical construction. Further for all embodiments, the regions are formed in a body of semiconductor material. In the embodiments of FIGS. 4 and 5 the wells 76 and 78 and polysilicon regions 58 and 64 are the functional equivalent of the body. It is also to be understood that, while the different embodiments have been described in terms of specific conductivity types for specific regions, the opposite conductivity types can also be used, so long as the relationships between the different conductivity types are maintained.

What is claimed is:

1. An integrated inverter circuit comprising a body of semiconductor material having opposing sides, said body including proximate one of said opposing sides:
   a first region of a first conductivity type;
   a second region of a second conductivity type disposed adjacent to said first region;
   a third region of said first conductivity type disposed adjacent to said second region;
   a fourth region of said second conductivity type disposed adjacent to said third region to form a diode therewith;
   a fifth region of said first conductivity type electrically coupled to said fourth region;
   a sixth region of said second conductivity type disposed adjacent to said fifth region to form a diode therewith;
   a seventh region of said first conductivity type disposed adjacent to said sixth region; and
   an eighth region of said second conductivity type disposed adjacent to said seventh region;
   said integrated circuit further comprising;
   first and second insulating layers overlying said second and seventh regions, respectively; and
   first and second gates overlying said first and second insulating layers, respectively, proximate said second and seventh regions, respectively.

2. The integrated circuit of claim 1, wherein said first conductivity type is N, and said second conductivity type is P.

3. The integrated circuit of claim 1, further comprising an insulating substrate disposed on the remaining opposing side of said body.

4. The integrated circuit of claim 3, wherein each of said diodes comprises a junction diffusion diode.

5. The integrated circuit of claim 3, wherein each of said diodes comprises a buried contact diode.

6. The integrated circuit of claim 3, wherein said substrate comprises sapphire.

7. The integrated circuit of claim 1, further comprising a conducting substrate disposed on the remaining one of said opposing sides of said body.

8. The integrated circuit of claim 7, wherein said fourth region is disposed in said third region, said fifth region is disposed in said sixth region, and each of said diodes comprises a junction diffusion diode.

9. The integrated circuit of claim 7, wherein said fourth and fifth regions comprise doped polycrystalline silicon.

10. The integrated circuit of claim 7, wherein said substrate comprises doped bulk silicon.

11. The integrated circuit of claim 10, wherein said body comprises first and second wells of the second and first conductivity types, respectively, extending a distance into said substrate from a surface thereof, said first well including said first, second and third regions, said second well including said sixth, seventh, and eighth regions.

* * * * *